(12) United States Patent
Reid

(10) Patent No.: US 8,353,332 B2
(45) Date of Patent: Jan. 15, 2013

(54) INTEGRATED ELECTRONICS COOLING DEVICE

(76) Inventor: Aarne H. Reid, Jupiter, FL (US)

( * ) Notice: Subject to any disclaimer, the term of this patent is extended or adjusted under 35 U.S.C. 154(b) by 94 days.

(21) Appl. No.: 12/903,544

(22) Filed: Oct. 13, 2010

(65) Prior Publication Data

US 2012/0090817 A1 Apr. 19, 2012

(51) Int. Cl.
*F28F 7/02* (2006.01)
*H05K 7/20* (2006.01)
(52) U.S. Cl. ........................ 165/80.4; 361/702
(58) Field of Classification Search ............... 165/80.4, 165/80.5; 361/702
See application file for complete search history.

(56) References Cited

U.S. PATENT DOCUMENTS

| | | | |
|---|---|---|---|
| 5,870,823 A | 2/1999 | Bezama et al. | |
| 6,166,907 A * | 12/2000 | Chien | 361/699 |
| 7,064,429 B2 | 6/2006 | Bemmerl et al. | |
| 7,139,172 B2 | 11/2006 | Bezama et al. | |
| 7,203,064 B2 | 4/2007 | Mongia et al. | |
| 7,258,161 B2 | 8/2007 | Cosley et al. | |
| 7,298,623 B1 | 11/2007 | Kuczynski et al. | |
| 7,334,630 B2 | 2/2008 | Goodson et al. | |
| 7,374,063 B2 * | 5/2008 | Reid | 220/592.27 |
| 7,460,369 B1 | 12/2008 | Blish, II | |
| 7,515,415 B2 | 4/2009 | Monfarad et al. | |
| 7,681,299 B2 | 3/2010 | Reid | |
| 2008/0036076 A1 * | 2/2008 | Ouyang | 257/714 |
| 2008/0285230 A1 * | 11/2008 | Bojan et al. | 361/689 |

FOREIGN PATENT DOCUMENTS

| | | |
|---|---|---|
| EP | 1294022 | 3/2003 |
| WO | WO 03/025476 | 3/2003 |

OTHER PUBLICATIONS

U.S. Appl. No. 12/766,397, filed Apr. 23, 2010, Reid.

* cited by examiner

*Primary Examiner* — Teresa Walberg
(74) *Attorney, Agent, or Firm* — Drinker Biddle & Reath LLP

(57) ABSTRACT

An integrated electronics cooling device including a substrate having a first surface for mounting one or more electronic components and a second surface, a cooling assembly including a cooling chamber bounded on one side by the second surface of the substrate, and a vacuum insulated coolant conduit for providing a coolant to and removing the coolant from the cooling assembly.

23 Claims, 5 Drawing Sheets

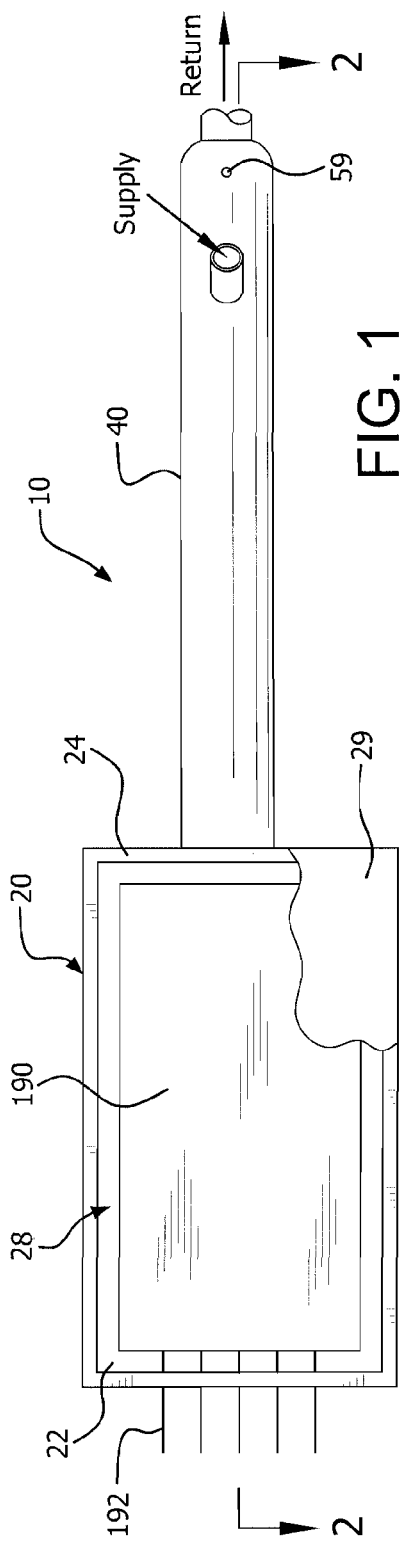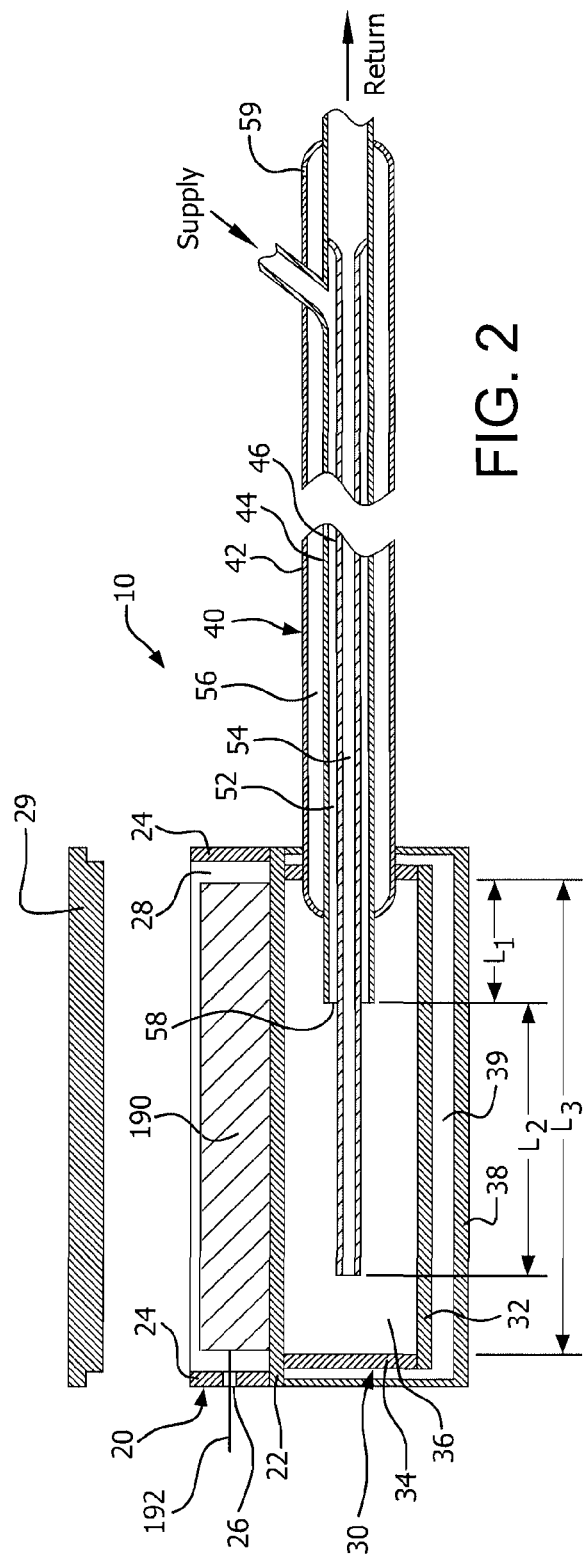

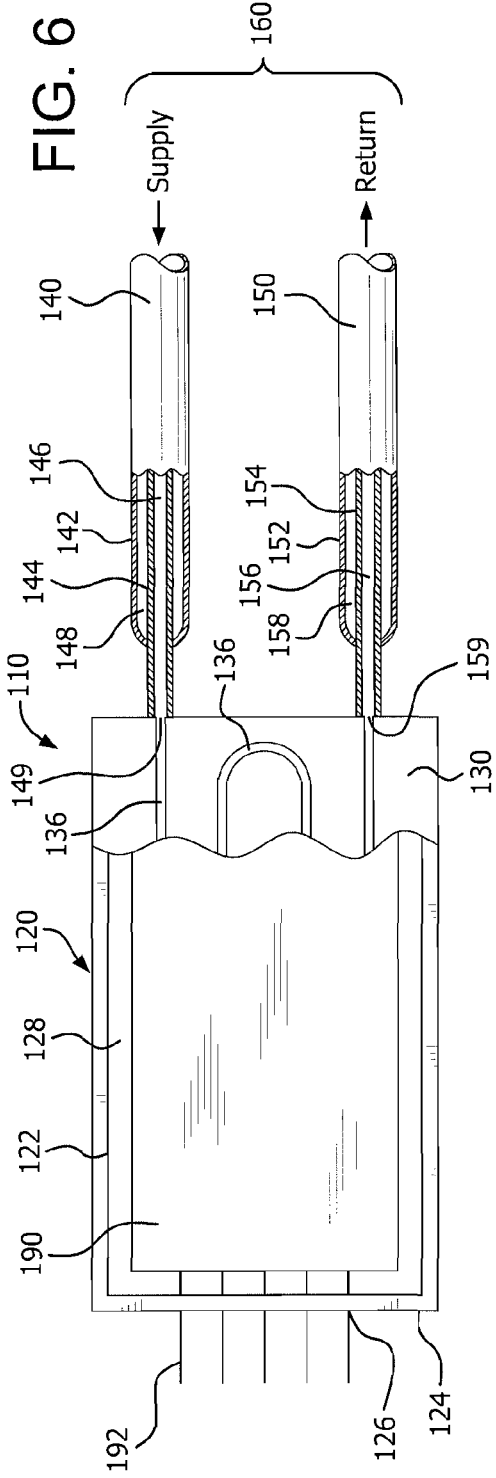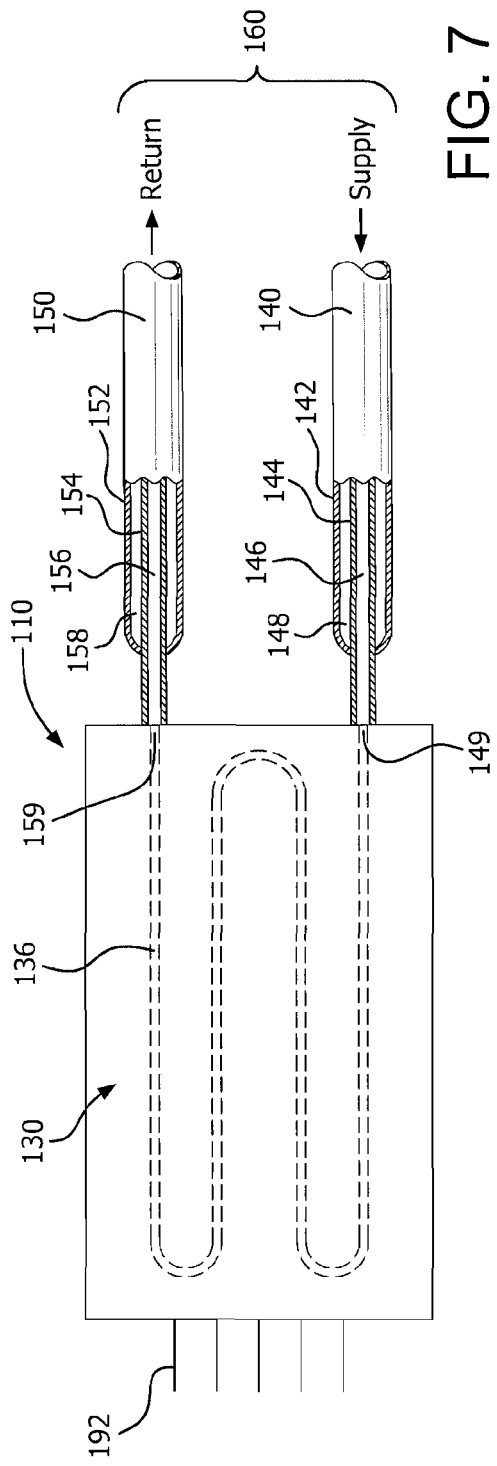

INTEGRATED ELECTRONICS COOLING DEVICE

FIELD

A mounting device for electronic components having an integrated cooling system is described.

BACKGROUND

It is well known that as electronic components become smaller and more dense, they generate higher concentrations of heat that must be removed if the electronic components are to function properly. In addition, many electronic components operate more efficiently at low temperatures, so that improvements in cooling result in corresponding improvements in efficiency. This is particularly true for electronics chips having high energy densities and consumption, such as those used in power supply or sensor applications. For example, infrared detection sensors such as those used in demanding military applications have high energy density and are far more efficient at low operating temperatures.

Conventional electronics packaging, including electronics mounting devices, often include passive heat sinks but not active mechanisms for heat transfer and removal. In particular, conventional electronics packaging does not make use of the tremendous cooling potential available from cryogenic fluids or other high thermal capacity coolants.

Moreover, the design of electronic systems is so complex that there are separate specialties and areas of expertise devoted to chip architecture and to cooling systems. As a result, a person skilled in one art (e.g., chip architecture) has no working knowledge of the other art (e.g., cooling systems) and vice versa. Therefore, to date, in part because the industry lacks persons possessing ordinary skill in both chip architecture and cooling systems, there is a great dearth of integration and an unmet need for an integrated electronics component cooling device.

SUMMARY

An embodiment of an integrated electronics cooling device is disclosed for use with a coolant. The coolant may be, but need not be, a cryogenic fluid. The device includes a substrate having a first surface for mounting one or more electronic components and a second surface, a cooling assembly including a cooling chamber bounded on one side by the second surface, and a vacuum insulated coolant conduit for providing a coolant to and removing the coolant from the cooling assembly.

Another embodiment of an integrated electronics cooling device using a coolant includes a mounting substrate having a first surface for mounting one or more electronic components and a second surface, a cooling assembly including a cooling chamber bounded on one side by the second surface, and a vacuum insulated coolant conduit for providing a coolant to and removing the coolant from the cooling assembly. The vacuum insulated coolant conduit includes an inner tube forming a tubular coolant passageway that communicates with the cooling chamber, a middle tube forming an annular coolant passageway between the middle tube and the inner tube that communicates with the cooling chamber, and an outer tube forming an annular vacuum insulated jacket between the outer tube and the middle tube.

Another embodiment of an integrated electronics cooling device using a coolant includes a mounting substrate having a first surface for mounting one or more electronic components and a second surface, a cooling assembly including a cooling plate having a groove formed in an first surface thereof, a coolant supply conduit, and a coolant return conduit. The first surface of the cooling plate is disposed in contact with the second surface of the substrate such that a cooling chamber is formed by the groove in the first surface of the cooling plate and the second surface of the substrate, the groove having an inlet end and an outlet end. The coolant supply conduit supplies a coolant to the inlet end of the groove, the coolant supply conduit having an outer tube and an inner tube, the inner tube forming a tubular coolant supply passageway that communicates with the cooling chamber, and the outer tube forming an annular vacuum insulated jacket between the outer tube and the inner tube. The coolant return conduit returns the coolant from the outlet end of the groove, the coolant return conduit having an outer tube and an inner tube, the inner tube forming a tubular coolant return passageway that communicates with the cooling chamber, and the outer tube forming an annular vacuum insulated jacket between the outer tube and the inner tube.

A method for cooling an electronic component is also disclosed. The method includes mounting the electronic component on a first surface of a substrate and providing a coolant via a vacuum insulated coolant conduit to a cooling chamber bounded on one side by a second surface of the substrate.

A cooling device using a coolant is disclosed, the device including a cooling plate having a first surface and a second surface, the first surface being exposed for contacting an object to be cooled, a cooling chamber bounded on one side by the second surface of the cooling plate and surrounded on at least one other side by a vacuum insulated jacket that is evacuated via a vent to achieve a vacuum deeper than the vacuum applied to the vent, and a vacuum insulated coolant conduit for providing a coolant to and removing the coolant from the cooling chamber. The coolant conduit includes an inner tube forming a tubular coolant passageway that communicates with the cooling chamber, a middle tube forming an annular coolant passageway between the middle tube and the inner tube that communicates with the cooling chamber, and an outer tube forming an annular vacuum insulated jacket between the outer tube and the middle tube, wherein the tubular coolant passageway is a coolant supply passageway for supplying the coolant to the cooling chamber and the annular coolant passageway is a coolant return passageway for returning the coolant from the cooling chamber.

BRIEF DESCRIPTION OF THE DRAWINGS

The above and other aspects, features and advantages of the disclosed embodiments will be more apparent from the following more particular description thereof, presented in conjunction with the following drawings wherein:

FIG. 1 is a top view of one embodiment of an integrated electronics cooling device.

FIG. 2 is a cross-sectional view of the cooling device of FIG. 1 through section 2-2.

FIG. 6 is a partially cut away top view of another embodiment of an integrated electronics cooling device.

FIG. 7 is a bottom view of the cooling device of FIG. 6.

DETAILED DESCRIPTION OF THE DRAWINGS

Figure 3:
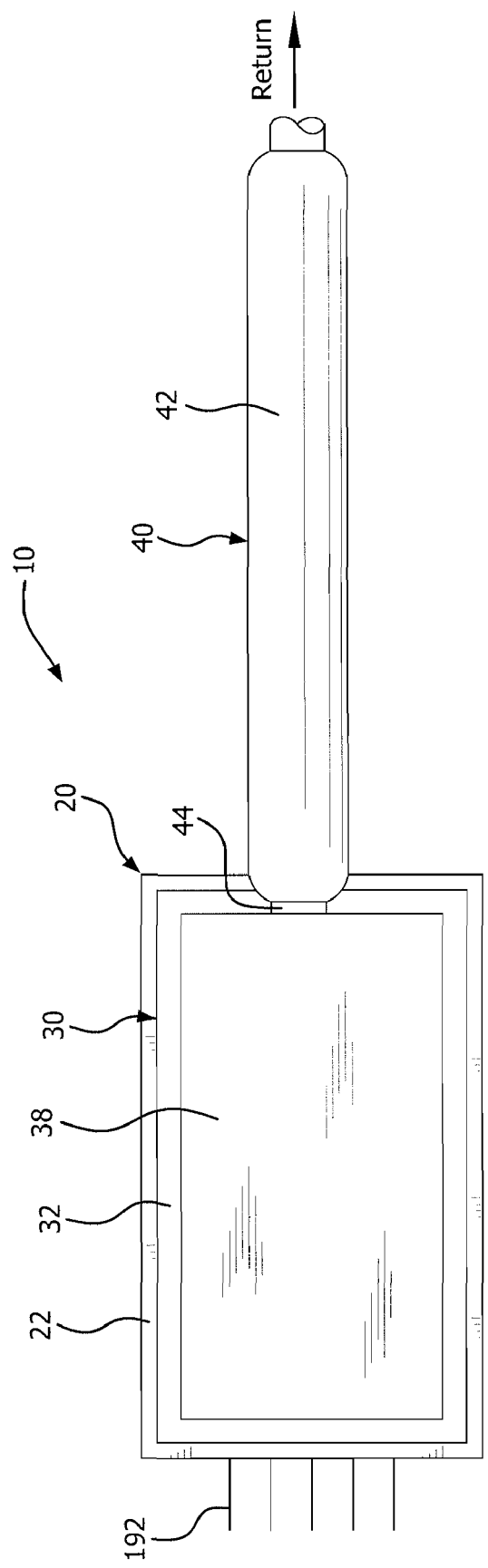
FIG. 3 is a bottom view of the cooling device of FIG. 1.

An embodiment of an integrated electronics cooling device 10 is shown in FIGS. 1-3. The cooling device 10 includes a chip holder 20 for receiving one or more electronic components 190, a cooling assembly 30 in intimate contact with the chip holder 20, and a vacuum insulated coolant conduit 40 for supplying a coolant fluid, such as a cryogenic liquid or gas, to the cooling assembly 30 and chip holder 20.

The chip holder 20 includes a base plate 22 which serves as a mounting substrate for one or more electronic components 190 such as electronic chips. Side walls 24 may extend upwardly from the base plate 22, bounding the perimeter of the base plate 22 to form an enclosure 28 for receiving the one or more electronic components 190. A top surface of the base plate 22 forms a base of the enclosure 28 such that the one or more electronic components are in intimate heat conductive contact with the base plate 22. The base plate 22 is preferably made from a material having a high conductive heat transfer coefficient but a low coefficient of thermal expansion.

It is common in the electronics industry to package electronics in Kovar, an iron-nickel-cobalt alloy, which has a coefficient of expansion similar to borosilicate glass, because it provides a stable expansion seal between metal and glass parts. In the present device, however, the base plate 22 can be made of a wide variety of materials, including but not limited to Kovar. For example, a copper alloy such as a copper-tungsten alloy can be used for the base plate 22. Alternatively, the base plate 22 can include material such as stainless steel, ceramics, or other material.

The side walls 24 can be brazed to the base plate 22 or attached to the base plate 22 by other means such as an adhesive. At least one side wall 24 includes one or more feedthrough openings 26 to allow for the passage of wires 192 for external electrical connections to the electronic components that are installed within the enclosure 28. A cover 29 may be provided for enclosing the electronic components in the enclosure 28.

The cooling assembly 30 includes a bottom wall 32 and side walls 34. The cooling assembly 30 is attached to a bottom side of the base plate 22 of the chip holder 20 so as to form a cooling chamber 36 bounded on one side by the bottom of the base plate 22. In one embodiment, the cooling assembly 30 is attached to the base plate 22 by brazing. Coolant is provided to the cooling chamber 36 via the coolant conduit 40. A vacuum insulated jacket 38 may be provided on at least a portion of the bottom wall 32 of the cooling assembly 30, the jacket 38 enclosing an evacuated space 39 to inhibit heat loss and to prevent condensation from forming on the cooling assembly 30 during operation. In some embodiments, the cooling assembly 30 is completely enclosed in a vacuum insulated jacket 38. The vacuum insulated jacket 38 can be evacuated to a pressure lower than the pressure applied to vent the jacket (i.e., the level of vacuum achieved in the vacuum insulated jacket 38 is deeper than the level of applied vacuum) as a result of the geometry of the walls bounding the vacuum insulated jacket 38 in the vicinity of a vent where vacuum is applied. The details of achieving such a vacuum are discussed in greater detail below.

The coolant conduit 40 operates to provide cooling to the cooling assembly 30 by supplying a coolant. In one embodiment, the coolant is a cryogenic fluid, for example a cryogenic liquid such as liquid nitrogen or a cryogenic gas such as cryogenically chilled helium. In other embodiments, the coolant can be any liquid or gaseous cooling medium capable of carrying heat away from the based plate 22, including but not limited to alcohol or an alcohol solution, glycol or a glycol solution, or chilled water. When cryogenic fluid is used, the cryogenic fluid is typically supplied as a liquid, under pressure, which may be expanded to a lower pressure liquid or to a gas as it enters the cooling assembly 30 in order to further drop the temperature of the coolant. In the embodiment depicted in detail in FIG. 2, the coolant conduit 40 includes a concentric tube structure having outer tube 42, a middle tube 44, and an inner tube 46. An annular coolant passageway 52 is formed between the middle tube 44 and the inner tube 46, the coolant passageway 52 communicating with the cooling chamber 36. A tubular coolant passageway 54 is formed within the inner tube 46, the passageway 54 communicating with the coolant chamber 36. In one embodiment, the annular passageway 52 is a coolant supply passageway to provide an inlet for flow of coolant to the cooling chamber 36, and the tubular passageway 54 is a coolant return passageway to provide an outlet for flow of coolant from the cooling chamber 36. In another embodiment, the tubular passageway 54 is a coolant supply passageway to provide an inlet for flow of coolant to the cooling chamber 36, and the annular passageway 52 is a coolant return passageway to provide an outlet for flow of coolant from the cooling chamber 36.

In one embodiment, liquid coolant is supplied through the supply passageway 52 and exits the supply passageway 52 into the cooling chamber 36 via an opening or orifice 58. The orifice 58 may simply be located at the end of the annulus formed between the middle tube 44 and the inner tube 46, or the orifice 58 may include one or more precisely sized orifices to enable control of the coolant pressure drop, temperature drop, and flow rate as the coolant enters the cooling chamber 36. The number and size of the orifices 58 can be selected based on the desired chilling effect, which depends on several factors, including but not limited to the pressure of the inlet fluid, the back-pressure of the outlet fluid, the flow rate of the inlet fluid, the state of the inlet fluid, and the initial temperature of the inlet fluid. In particular, the available coolant supply pressure combined with the coolant outlet back pressure bounds the maximum pressure expansion ratio. To maximize the coolant return-to-supply flow area ratio, and thus decrease the coolant outlet back pressure, the inner tube 46 and the middle tube 44 can be sized such that the annular supply passageway 52 is extremely small while the inner diameter of the inner tube 46 is comparatively larger.

In some applications, the coolant remains a liquid in the cooling chamber 36, and the intimate contact between the liquid coolant and the base plate 22 of the chip holder 20 provides for a high rate of heat transfer from the electronic components 200 to the coolant. In other applications, the coolant is expanded from a liquid to a gas to take advantage of adiabatic expansion cooling, which can substantially drop the temperature of the coolant in the cooling chamber 36 to enhance heat removal from the base plate 22 of the chip holder 20. The warmed coolant, whether liquid or gas, is returned via the coolant return passageway 54. The coolant system may be a closed loop, in which the returned coolant is rechilled and recycled. In a closed loop system, the coolant may be pressurized to a high pressure. Alternatively, the coolant system may be an unpressurized open loop in which the returned coolant is discarded.

For a given inside diameter of the middle tube 44, the thickness and diameter of the inner tube 46 are sized with consideration of the ratio of the tubular passageway 54 cross-sectional area to the annular passageway 52 cross-sectional area and the heat transfer surface area between the passageways 52, 54. As a result of the presently disclosed configuration, both parameters can be optimized at the same time, in contrast to prior designs in which one parameter was improved at the expense of the other. In particular, in an embodiment of the coolant conduit described herein, increasing the diameter of the inner tube 46, assuming the thickness of the tube 46 is held constant, increases both the coolant return-to-supply flow area ratio and the heat transfer surface area, since the inner diameter of the inner tube 46 increases while the annular gap 52 between the inner tube 46 and the middle tube 44 decreases. In contrast, in prior designs, in which a tubular passageway was used for coolant supply and an annular passageway was used for coolant return, increasing the diameter of the coolant passageway wall would increase the heat transfer area at the expense of the coolant return-to-supply flow area (which is the inverse of the coolant return-to-supply flow area described herein). In one embodiment, the coolant return-to-supply flow area ratio is equal to or greater than 1. In other embodiments, the coolant return-to-supply flow area ratio can range between about 2.7 and about 36, typically between about 2.7 and about 15, and most typically between about 2.7 and about 10.

The ability to improve both the coolant return-to-supply flow area ratio and the heat exchange surface area at the same time provides significant benefits with regard to improving the cooling efficiency of the cooling assembly 30. First, a larger return-to-supply flow area ratio decreases the backpressure on the expanded coolant fluid flowing in the tubular coolant outlet passageway 54, thereby allowing a greater pressure drop across the orifice 58 which results in greater cooling effect due to the expansion. Second, a larger heat transfer surface area improves the quenching of the supply coolant flowing in the annular coolant inlet passageway 52. Thus, the lower pressure expanded fluid is not only colder, but is enabled to transfer more cooling back to the higher pressure supply fluid, creating a positive feedback loop that continues to make the expanded fluid even colder. Additionally, in the probe design disclosed herein, beneficial results can actually be obtained by making the probe longer, because increased length results in only a minimal increase in pressure drop in the coolant outlet passageway 54 but a large increase (proportional to length) in the heat transfer surface area. In contrast, in prior conduit designs having a small coolant return-to-supply flow area ratio, increasing the length of the probe incurred significant penalties in increased pressure drop (and back pressure) in the coolant outlet passageway 54, which outweighed any benefits of increased heat transfer surface area.

An annular vacuum insulated space 56 is formed between the outer tube 42 and the middle tube 44 to insulate the annular coolant passageway 52 and the tubular coolant passageway 54, to minimize warming of the coolant and to inhibit vaporization of the coolant, particularly in the supply passageway. The vacuum insulated space 56 is evacuated through a vent 59. In one embodiment, the vacuum insulated space 56 achieves a pressure lower than the pressure applied to the vent 59 (i.e., the level of vacuum achieved in the vacuum insulated space 56 is deeper than the level of vacuum applied to the vent 59) as a result of the geometry of the walls bounding the vacuum insulated space 56 in the vicinity of the vent 59. In particular, the middle tube 44 and the outer tube 42 are configured in the vicinity of the vent 59 to preferentially direct gas molecules toward the vent 59 in an ultra-low pressure free molecular flow regime in which the frequency of gas molecule collisions with the walls exceeds the frequency of gas molecule collisions with each other.

The outer tube 42 and the middle tube 44 are configured to work in conjunction with one another to enable a depth of vacuum to be achieved within the insulated space 56 that is greater than the vacuum applied to evacuate the insulated space 56 via the vent 59. In particular, the relative geometry of the tubes 42 and 44 adjacent to the vent 59 has a guiding effect on gas molecules in a free molecular flow regime so that the flux of gas molecules out the vent 59 is greater than the flux of gas molecules into the vent 59. A highly insulated space having a low vacuum created by such geometry can be used in devices of miniature scale or in devices having insulating spaces of extremely narrow width. For example, insulated spaces 56 have been created incorporating this geometry with gaps between the walls 42 and 44 on the order of 0.002 inches or smaller. The insulating space 56 is evacuated prior to using the coolant conduit 40 for a cooling application. Other exemplary geometries to achieve such a deeper vacuum are disclosed in detail in commonly owned U.S. Pat. Nos. 7,374,063 and 7,681,299, and U.S. patent application Ser. No. 12/766,397, filed on Apr. 23, 2010.

In gases under relatively modest vacuums, for example at pressures equal to or greater than about $10^{-2}$ torr at about 70° F., molecule-to-molecule collisions dominate such that the number of interactions between the gas molecules themselves is large in comparison to the number of interactions between the gas molecules and the walls of a container for the gas molecules. In this circumstance, Maxwell's gas law accurately describes the molecular kinetic behavior of gas molecules. However, at greater (deeper) levels of vacuum, for example at pressures less than about $10^{-2}$ torr, and particularly at pressures less than about $10^{-4}$ torr at about 70° F., a free molecular flow regime takes over because the scarcity of gas molecules causes the number of interactions between the gas molecules and the walls of the container to be large in comparison with the interactions between the gas molecules themselves. At such low pressures, the geometry of a space to which vacuum is applied becomes a controlling factor in the rate at which gas molecules exit the space via a vent as compared with the rate at which gas molecules enter the space via the vent.

The geometry of the insulated space 56 near the vent 59 guides gas molecules within the insulated space 56 toward the vent 59. In particular, the outer tube 42 converges toward the middle tube 44 approaching the vent 59. Alternatively, the middle tube 44 can converge toward the outer tube 42 approaching the vent 59. In addition, while vacuum is being applied to the vent 59, the coolant conduit 40 may be heated to accelerate the motion of the gas molecules within the insulated space 56, so as to further bias the flux of gas molecules outward from the vent 59 as compared with inward into the vent 59. For example, the coolant conduit 40 may be heated to an elevated temperature and held at that temperature for a period of time during the evacuation process. Longer hold times may be used to further increase the vacuum achievable in the insulated space 56.

The resultant vacuum that is achieved within the insulated space 56 is at a deeper vacuum (i.e., a lower pressure, closer to complete vacuum) than the level of vacuum applied external to the vent 59. This somewhat counterintuitive result is caused by the geometry of the tubes 42 and 44 adjacent to the vent 59, which significantly increases the probability that a gas molecule, in the free molecular flow regime occurring at very low pressures, will leave rather than enter the insulated space 56. In effect, the geometry of the tubes 42 and 44 functions like a partial check valve to facilitate free passage of gas molecules in one direction (outward from the insulated space 56 via the vent 59) while inhibiting passage in the opposite direction.

Once a desired level of vacuum has been achieved in the insulated space 56, the vent 59 is sealed to maintain the vacuum. In one embodiment, the vent 59 is sealable by a brazing material that melts and flows into the vent 59 when heated to a brazing temperature, so that the ends of the tubes 42 and 44 are brazed together and the insulated space 56 is sealed off. The use of brazing to seal the evacuation vent of a vacuum-sealed structure is generally known in the art. To seal the vent 59, a brazing material (not shown) is positioned between the outer tube 42 and the middle tube 44 adjacent to their ends in such a manner that during the evacuation process (i.e., prior to the brazing process) the vent 59 is not blocked by the brazing material. Toward the end of the evacuation process, as the desired level of vacuum is being achieved in the insulated space 56, sufficient heat is applied to the coolant conduit 40 to melt the brazing material such that it flows by capillary action into the vent 59. The flowing brazing material seals the vent 59 and blocks the evacuation path from the insulated space 56. Flowing of the brazing material is facilitated by any preheating that occurs by heating of the coolant conduit 40 during the evacuation phase in order to enhance the ultimate level of vacuum achieved in the insulated space 56. Alternatively, other processes can be used for sealing the vent 59, including but not limited to a metallurgical process or a chemical process.

By being able to achieve a deep vacuum due to the geometry of the insulated space 56 and without need for a getter material, the insulated space 56 (a function of the radial distance between the outer tube 42 and the middle tube 44) can be kept very small, for example on the order of a few thousands of an inch, which in turn allows for miniature devices using such an insulated space 56. To enhance the insulating properties of the sealed evacuated insulated space 56, an optical coating having low-emissivity properties may be applied to an outer surface of the middle tube 44 and/or to an inner surface of the outer tuber 42 to limit radiative heat transfer across the insulated space 56. Any low emissivity surfaces known in the art can be used.

In part due to the extraordinary insulation achieved by an ultra-low vacuum in the vacuum insulated space 56, the coolant conduit 40 can be of any length, including as long as many feet, and can be rigid or flexible.

As shown in FIG. 2, the middle tube 44 can extend beyond an inner surface of the wall 24 of the cooling chamber 36 by a distance designated as L1, the inner tube 46 can extend beyond the outer tube 42 by a distance designated as L2, and the distance across the cooling chamber 36 is designated as L3. The distance L1 can be varied from zero, such that the middle tube 44 terminates and forms the orifice 58 near one side of the cooling chamber 36, to nearly as large as L3, such that the middle tube 44 extends nearly all the way through the cooling chamber 36 before forming the orifice 58. Similarly, the distance L2 can be varied from zero to nearly as long as L3. Within those bounds, the distance L2 is preferably equal to or greater than the distance L1 such that the inner tube 46 extends beyond the orifice 58 formed at or near the end of the middle tube 44. By adjusting one or both of the distances L1 and L2, the size and shape of a cooling region on the base plate 22 can be controlled. In an example, when the distance L2 is adjusted to be relatively short compared with L1, a short concentrated cooling region is created near the orifice 58. In another example, when the distance L2 is adjusted to be relatively long compared with L1, an extended cooling region is created along the length the inner tube 46 that extends beyond the orifice 58 (i.e., along the distance that represents the difference between L2 and L1).

Another embodiment of an integrated electronics cooling device 110 is shown in FIGS. 6-7. The cooling device 110 includes a chip holder 120 for receiving one or more electronic components 190, a cooling base 130 in intimate contact with the chip holder, and a coolant conduit assembly 160 including a supply conduit 140 and a cooling return conduit 150 for supplying a coolant fluid to the base 130 and the chip holder 120.

The chip holder 120 has a chilled base plate 122 and side walls 124 bounding the perimeter of the base plate 122 to form an enclosure 128 for receiving one or more electronic components 200 such as electronic chips. A top surface of the base plate 122 forms a base of the enclosure 128 such that the one or more electronic components are in intimate heat conductive contact with the base plate 122. At least one side wall 124 includes one or more feed through openings 126 to allow for the passage of wires 192 for external electrical connections to the electronic components that are installed within the enclosure 128. A cover (not shown) may be provided for enclosing the electronic components in the enclosure 128.

The cooling base 130 includes a base plate 132 and a groove 134 integrally formed into one face of the cooling base 132, such that when the cooling base 130 is affixed to the base plate 122, a cooling channel 136 is formed for coolant to flow between the groove 134 and a bottom side of the base plate 122, in intimate heat transfer contact with the base plate 122.

The supply conduit 140 includes a concentric tube structure having an outer tube 142 and an inner tube 144. A coolant supply passageway 146 is formed within the inner tube 144 to provide an inlet for flow of coolant to the cooling chamber 136. An annular vacuum insulated space 148 is formed between the outer tube 142 and the inner tube 144 to insulate the coolant supply passageway 146. Liquid coolant is supplied through the supply passageway 146 and exits the supply passageway 146 into the cooling chamber 136 via an opening or orifice 149. The orifice 149 may have the same cross-sectional area as the cooling chamber 136, or the orifice 149 may include one or more separate openings having a combined flow area smaller than that of the cooling chamber 136. After crossing the orifice 149, the coolant may remain liquid or may be flashed into a gas, depending on the pressure drop across the orifice as well as the supply (or return) pressure of the coolant.

The return conduit 150 includes a concentric tube structure having an outer tube 152 and an inner tube 154. A coolant return passageway 156 is formed within the inner tube 154 to provide an outlet for flow of coolant from the cooling chamber 136. An annular vacuum insulated space 158 is formed between the outer tube 152 and the inner tube 154 to insulate the coolant return passageway 156. Coolant enters the return passageway 156 from the cooling chamber 136 via an opening or orifice 159 that has approximately the same cross-sectional flow area as the cooling chamber 136.

The insulating jackets 148 and 158 of the supply conduit 140 and return conduit 150, respectively, are each evacuated through a vent (not shown) to achieve a vacuum deeper than that applied to the vent due to the geometric configuration of each middle tube 144, 154 and its corresponding outer tube 142, 152 in the vicinity of the vent, as described above.

Figure 4:
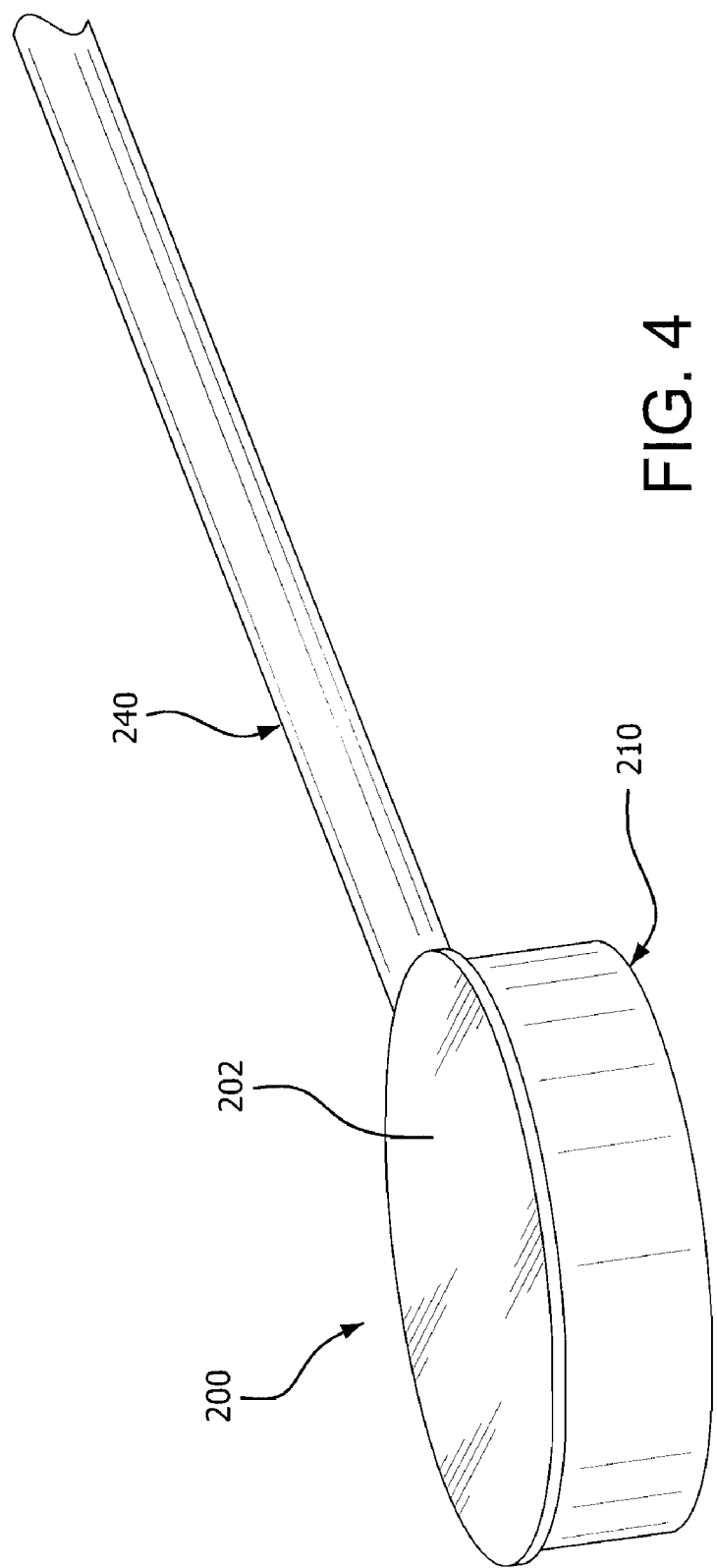
FIG. 4 is a perspective view of one embodiment of a cooling paddle for use in cooling electronics components, alone or as part of an integrated electronics cooling device.
Figure 5:
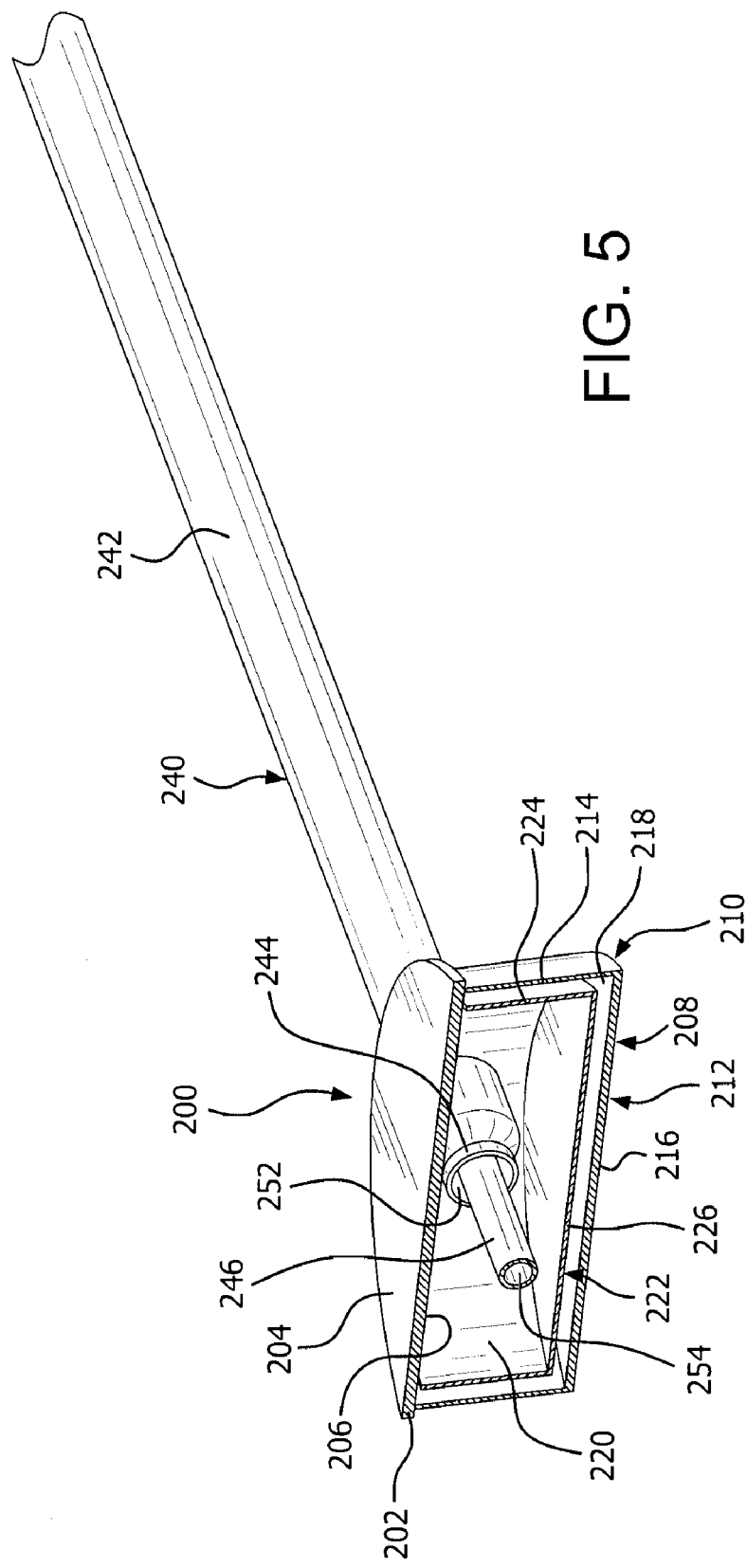
FIG. 5 is a partial cutaway view of the cooling paddle of FIG. 4 showing the interior of the cooling chamber.

FIGS. 4 and 5 show an embodiment of a cooling device 200 that can be mounted to or placed into a heat conductive interface with an electronic component holder to provide cooling to electronic components mounted in the holder. The cooling device 200 includes a cooling paddle 210 that is supplied with cooling via a coolant conduit 240. The coolant conduit 240 is of the type described above with regard to FIGS. 1-3. In particular, the coolant conduit 240 includes a concentric tube structure having outer tube 242, a middle tube 244, and an inner tube 246. An annular coolant passageway 252 is formed between the middle tube 244 and the inner tube 246, the coolant passageway 252 communicating with a cooling chamber 236 within the cooling paddle 210. A tubular coolant passageway 254 is formed within the inner tube 246, the coolant passageway 254 communicating with the coolant chamber 236. In one embodiment, the annular passageway 252 is a coolant supply passageway to provide an inlet for flow of coolant to the cooling chamber 236, and the tubular passageway 254 is a coolant return passageway to provide an outlet for flow of coolant from the cooling chamber 236. In another embodiment, the tubular passageway 254 is a coolant supply passageway to provide an inlet for flow of coolant to the cooling chamber 236, and the annular passageway 252 is a coolant return passageway to provide an outlet for flow of coolant from the cooling chamber 236.

When the annular passageway 252 is used for coolant supply and the tubular passageway 254 is used for coolant return, for a given inside diameter of the middle tube 244, the thickness and diameter of the inner tube 246 are sized with consideration of the ratio of the tubular passageway 254 cross-sectional area to the annular passageway 252 cross-sectional area and the heat transfer surface area between the passageways 252, 254. Increasing the diameter of the inner tube 246, assuming the thickness of the tube 246 is held constant, increases both the coolant return-to-supply flow area ratio and the heat transfer surface area, since the inner diameter of the inner tube 246 increases while the annular gap 252 between the inner tube 246 and the middle tube 244 decreases. In one embodiment, the coolant return-to-supply flow area ratio is equal to or greater than 1. In other embodiments, the coolant return-to-supply flow area ratio can range between about 2.7 and about 36, typically between about 2.7 and about 15, and most typically between about 2.7 and about 10.

The cooling chamber 236 within the cooling paddle 210 is vacuum insulated by a vacuum insulated jacket 212 that is evacuated in the same manner as described herein. The cooling chamber 236 is enclosed by an inner jacket wall 222 and a bottom surface 206 of a cooling plate 202. The inner jacket wall 222 has bottom wall 226 and a sidewall 224 joining the bottom wall 226 with the bottom surface 206 of the cooling plate 202. An outer jacket wall 212 cooperates with the inner jacket wall 222 and an outer portion of the bottom surface 206 of the cooling plate 202 to form the vacuum insulated jacket 212, which encloses a vacuum insulated space 218. The outer jacket wall 212 includes a bottom wall 216 and a sidewall 214 joining the bottom wall 216 with the bottom surface 206 of the cooling plate 202. A top surface 204 of the cooling plate 202 is adapted to be placed into intimate heat transfer contact with a bottom surface of an electronics component holder.

The foregoing describes the invention in terms of embodiments foreseen by the inventors for which an enabling description was available, notwithstanding that insubstantial modifications of the invention, not presently foreseen, may nonetheless represent equivalents thereto.

The invention claimed is:

1. An integrated electronics cooling device comprising:
a substrate having a first surface for mounting one or more electronic components and a second surface;
a cooling assembly including a cooling chamber bounded on one side by the second surface of the substrate;
a vacuum insulated coolant conduit for providing a coolant to and removing the coolant from the cooling assembly, the vacuum insulated coolant conduit including:
an inner tube forming a tubular coolant passageway that communicates with the cooling chamber;
a middle tube forming an annular coolant passageway between the middle tube and the inner tube that communicates with the cooling chamber;
an outer tube forming an annular vacuum insulated jacket between the outer tube and the middle tube;
wherein one of the tubular coolant passageway and the annular coolant passageway is a coolant supply passageway for supplying the coolant to the cooling chamber and the other of the tubular coolant passageway and the annular coolant passageway is a coolant return passageway for returning the coolant from the cooling chamber; and
wherein the annular coolant passageway is the coolant supply passageway and the tubular coolant passageway is the coolant return passageway; and
at least one side wall extending around a perimeter of the substrate to form an enclosure for receiving the one or more electronic components.

2. The cooling device of claim 1, further comprising at least one feedthrough opening in one of the side walls for wiring to pass from outside the cavity to the one or more electronic components.

3. The cooling device of claim 1, further comprising a cover adapted to enclose the enclosure formed by the first surface of the substrate and the at least one side wall.

4. The cooling device of claim 1, wherein the vacuum insulated jacket is evacuated via a vent to achieve a vacuum deeper than the vacuum applied to the vent.

5. The cooling device of claim 1, further composing an orifice located between the coolant supply passageway and the cooling chamber, the orifice having a cross-sectional flow area less than or equal to the cross-sectional flow area of the coolant supply passageway.

6. The cooling device of claim 1,
wherein the cooling assembly includes a second plate that, in combination with the at least one side wall and the second surface of the substrate, encloses the cooling chamber.

7. The cooling device of claim 1, wherein the coolant is a cryogenic coolant.

8. An integrated electronics cooling device comprising:
a substrate having a first surface for mounting one or more electronic components and a second surface;
a cooling assembly including a cooling chamber bounded on one side by the second surface of the substrate;
a vacuum insulated coolant conduit for providing a coolant to and removing the coolant from the cooling assembly, the vacuum insulated coolant conduit including:
an inner tube forming a tubular coolant passageway that communicates with the cooling chamber;
a middle tube forming an annular coolant passageway between the middle tube and the inner tube that communicates with the cooling chamber;
an outer to tube forming an annular vacuum isolated jacket between the outer tube and the middle tube;
wherein one of the tubular coolant passageway and the annular coolant passageway is a coolant supply passageway for supplying the coolant to the cooling chamber and the other of the tubular coolant passageway and the annular coolant passageway is a coolant return passageway for returning the coolant from the cooling chamber; and wherein the annular coolant passageway is the coolant supply passageway and the tubular coolant passageway is the coolant return passageway; and an orifice located between the coolant supply passageway and the cooling chamber, the orifice having cross-sectional flow area less than or equal to the cross-sectional flow area of the coolant supply passageway;

wherein the coolant is a liquid coolant that adiabatically expands into a gas across the orifice.

9. An integrated electronics cooling device, comprising:
a substrate having a first surface for mounting one or more electronic components and a bottom surface;
a cooling assembly including a cooling chamber bounded on one side by the second surface of the substrate;
a vacuum insulated coolant conduit for providing a coolant to and removing the coolant from the cooling assembly;
an inner tube forming a tubular coolant passageway that communicates with the cooling chamber;
a middle tube forming an annular coolant passageway between the middle tube and the inner tube that communicates with the cooling chamber; and
an outer tube forming an annular vacuum insulated jacket between the outer tube and the middle tube;
wherein one of the tubular coolant passageway and the annular coolant passageway is a coolant supply passageway for supplying the coolant to the cooling chamber and the other of the tubular coolant passageway and the annular coolant passageway is a coolant return passageway for returning the coolant from the cooling chamber; and
wherein the inner tube extends into the cooling chamber by a first distance greater than or equal to zero, the first distance at least partially controlling the size and shape of a cooling region on the substrate.

10. The cooling device of claim 9, wherein the middle tube extends a second distance into the cooling chamber, the second distance being less than or equal to the first distance, the relationship between the first distance and the second distance further controlling the size and shape of the cooling region on the substrate.

11. An integrated electronics cooling device comprising:
a substrate having a first surface for mounting one or more electronic components and a second surface;
a cooling assembly including a cooling chamber bounded on one side by the second surface of the substrate;
a vacuum insulated coolant conduit for providing a coolant to and removing the coolant from the cooling assembly, the vacuum insulated coolant conduit comprising:
a coolant supply conduit having an outer tube and an inner tube, the inner tube forming a tubular coolant supply passageway that communicates with the cooling chamber, the outer tube forming an annular vacuum insulated jacket between the outer tube and the inner tube; and
a coolant return conduit having an outer tube and an inner tube, the inner tube forming a tubular coolant return passageway that communicates with the cooling chamber, the outer tube forming an annular vacuum insulated jacket between the outer tube and the inner tube;
the cooling assembly comprising a cooling plate having a groove formed in a first surface thereof, the first surface of the cooling plate being disposed in contact with the second surface of the substrate such that the cooling chamber is bounded by the groove, in the first surface of the cooling plate and the second surface of the substrate, the groove having an inlet end communicating with the coolant supply passageway and an outlet end communicating with the coolant return passageway.

12. The cooling, device of claim 11, further comprising an orifice located between the coolant supply passageway and the inlet end of the groove, the orifice having a cross-sectional flow area equal too less than the cross-sectional flow area of the coolant supply passageway.

13. An integrated electronics cooling device comprising:
a mounting substrate having a first surface for mounting one or more electronic components and a second surface;
a cooling, assembly including a cooling chamber bounded on one side by the second surface of the mounting substrate;
a vacuum insulated coolant conduit for providing a coolant to and removing the coolant from the cooling assembly, the vacuum insulated coolant conduit including an inner tube forming a tubular coolant return passageway that communicates with the cooling chamber, a middle tube forming an annular coolant supply passageway between the middle tube and the inner tube that communicates with the cooling chamber, and an outer tube forming an annular vacuum insulated jacket between the outer tube and the middle tube; and
a vacuum insulated chamber insulating at least a portion of the cooling assembly to inhibit condensation from forming on the cooling assembly.

14. The cooling device of claim 13, wherein the vacuum insulated jacket is evacuated via a vent to achieve a vacuum deeper than the vacuum applied to the vent.

15. The cooling device of claim 13, wherein the coolant is a cryogenic coolant.

16. An integrated electronics cooling device compromising:
a mounting substrate having a first surface for mounting one or more electronic components and a second surface;
a cooling assembly including a cooling plate having a groove formed in a first surface thereof, the first surface of the cooling plate being disposed in contact with the second surface of the substrate such that a cooling chamber formed by the groove in the first surface of the cooling plate and the second surface of the substrate, the groove having an inlet end and an outlet end;
a coolant supply conduit for supplying a coolant to the inlet end of the groove, the coolant supply conduit having an outer tube and an inner tube, the inner tube forming a tubular coolant supply passageway that communicates with the cooling chamber, the outer tube forming an annular vacuum insulated jacket between the outer tube and the inner tube; and
a coolant return conduit for returning the coolant from the outlet end of the groove, the coolant return conduit having an outer tube and an inner tube, the inner tube forming a tubular coolant return passageway that communicates with the cooling chamber, the outer tube forming an annular vacuum insulated jacket between the outer tube and the inner tube.

17. The cooling device of claim 16, wherein each of the vacuum insulated jackets is evacuated via a vent to achieve a vacuum deeper than the vacuum applied to the vent.

18. The cooling device of claim 16, further comprising, an orifice located between the coolant supply passageway and the inlet end of the groove, the orifice having a cross-sectional flow area equal to or less than the cross-sectional flow area of the coolant supply passageway.

19. The cooling device of claim 16, further comprising:
a vacuum insulated chamber insulating at least a portion of the cooling assembly to inhibit condensation from forming on the cooling assembly.

20. A method for cooling an electronic component, comprising:
mounting the electronic component on a first surface of a substrate;
providing a cryogenic coolant via a vacuum insulated coolant conduit to a cooling chamber bounded on one side by a second surface of the substrate, the cooling chamber including a cavity formed by a cooling assembly attached to the second surface of the substrate, the vacuum insulated coolant conduit including an inner tube forming a tubular coolant passageway that communicates with the cooling chamber, a middle tube forming an annular coolant passageway between the middle tube and the inner tube that communicates with the cooling chamber, and an outer tube forming an annular vacuum insulated jacket between the outer tube and the middle tube;
supplying a coolant to the cooling chamber via the annular coolant passageway; and
returning the coolant from the cooling chamber via the tubular coolant passageway.

21. A method for cooling an electronic component, comprising:
mounting the electronic component on a first surface of a substrate;
providing a cryogenic coolant via a vacuum insulated coolant conduit to a cooling chamber bounded on one side by a second surface of the substrate, the cooling chamber including a cooling plate having a groove formed in an first surface thereof, the first surface of the cooling plate being disposed in contact with the second surface of the substrate such that the cooling chamber is bounded by the groove in the first surface of the cooling plate and the second surface of the substrate, the groove having an inlet end and an outlet end, the vacuum insulated coolant conduit including a coolant supply conduit communicating with the inlet end of the groove, the coolant supply conduit having an outer tube and an inner tube, the inner tube forming a tubular coolant supply passageway that communicates with the cooling chamber, the outer tube forming an annular vacuum insulated jacket between the outer tube and the inner tube, and a coolant return conduit communicating with the outlet end of the groove, the coolant return conduit having an outer tube and an inner tube, the inner tube forming a tubular coolant return passageway that communicates with the cooling chamber, the outer tube forming an annular vacuum insulated jacket between the outer tube and the inner tube;
supplying a coolant to the inlet end of the groove via the coolant supply passageway; and
returning the coolant from the outlet end of the groove via the coolant return passageway.

22. A cooling device for use with a coolant, the device comprising:
a cooling plate having a first surface and a second surface, the first surface being exposed for contacting an object to be cooled;
a cooling chamber bounded on one side by the second surface of the cooing plate and surrounded on at least one other side by a vacuum insulated jacket that is evacuated via a vent to achieve a vacuum deeper than the vacuum applied to the vent; and
a vacuum insulated coolant conduit for providing a coolant to and removing the coolant from the cooling chamber, the coolant conduit comprising:
an inner tube forming a tubular coolant passageway that communicates with the cooling chamber;
is middle tube forming an annular coolant passageway between the middle tube and the inner tube that communicates with the cooling chamber; and
an outer tube forming an annular vacuum insulated jacket between the outer tube and the middle tube;
wherein the tubular coolant passageway is a coolant supply passageway for supplying the coolant to the cooling chamber and the annular coolant passageway is a coolant return passageway for returning the coolant front the cooling chamber;
wherein the inner tube extends into the cooling chamber by a first distance greater than or equal to zero, the first distance at least partially controlling the size and shape of a cooling region on the substrate.

23. The cooling device of claim 22, wherein the middle tube extends a second distance into the cooling chamber, the second distance being less than or equal to the first distance, the relationship between the first distance and the second distance further controlling the size and shape of the cooling region on the substrate.

* * * * *